United States Patent [19]
Cova et al.

[11] Patent Number: 6,104,241
[45] Date of Patent: Aug. 15, 2000

[54] HIGH EFFICIENCY FEED-FORWARD RF POWER AMPLIFIER WITH PREDISTORATION ENCHANCEMENT

[75] Inventors: Armando C. Cova, Sunnyvale; Lance T. Mucenieks, Boulder Creek, both of Calif.

[73] Assignee: Spectrian, Sunnyvale, Calif.

[21] Appl. No.: 09/356,166

[22] Filed: Jul. 16, 1999

Related U.S. Application Data

[63] Continuation-in-part of application No. 09/195,536, Nov. 18, 1998.
[51] Int. Cl.[7] .............................. H03F 1/26; H03F 1/00; H04K 1/02
[52] U.S. Cl. .......................... 330/149; 330/151; 375/296
[58] Field of Search ................................. 330/149, 151; 375/296, 297

[56] References Cited

U.S. PATENT DOCUMENTS

| | | | |
|---|---|---|---|
| 5,489,875 | 2/1996 | Carers | 330/151 |
| 5,528,196 | 6/1996 | Baskin et al. | 330/151 |
| 5,594,385 | 1/1997 | Anvari | 330/149 |
| 5,617,061 | 4/1997 | Fukuchi | 330/151 |
| 5,768,699 | 6/1998 | Behan et al. | 455/296 |
| 5,770,971 | 6/1998 | McNicol | 330/52 |
| 5,774,018 | 6/1998 | Gianfortune et al. | 330/52 |
| 5,789,927 | 8/1998 | Belcher | 324/622 |
| 5,789,976 | 8/1998 | Ghannouchi et al. | 330/52 |
| 5,877,653 | 3/1999 | Kim et al. | 330/149 |
| 5,898,339 | 4/1999 | Maruyama et al. | 330/149 |
| 5,912,586 | 12/1997 | Mitzlaff | 330/149 |

*Primary Examiner*—Benny Lee
*Assistant Examiner*—Patricia T. Nguyen
*Attorney, Agent, or Firm*—Charles E Wands

[57] ABSTRACT

An RF power amplifier linearization architecture contains main and auxiliary path RF amplifiers. A distortion-inverting circuit extracts the distortion component from the output signal of the main amplifier and combines it with a delayed sample of the RF input signal to drive an auxiliary path RF amplifier, via a predistorter. An output quadrature hybrid combines the output of the main and auxiliary path amplifiers. The cascading of the distortion-inverting circuit with the predistorter compensates for the non-linear behavior of the auxiliary path RF power amplifier thereby producing a composite signal at the output quadrature hybrid, in which RF carrier components from each amplifier combine constructively while distortion components cancel.

20 Claims, 2 Drawing Sheets

HIGH EFFICIENCY FEED-FORWARD RF POWER AMPLIFIER WITH PREDISTORATION ENCHANCEMENT

CROSS-REFERENCE TO RELATED APPLICATION

The present application is a continuation-in-part of co-pending U.S. patent application Ser. No. 09/195,536, filed Nov. 18, 1998, by L. Mucenieks et al, entitled: "RF Power Amplifier Linearization Using Parallel RF Power Amplifiers Having Intermod-Complementing Predistortion Paths," (hereinafter referred to as the '536 application), assigned to the assignee of the present application and the disclosure of which is incorporated herein.

FIELD OF THE INVENTION

The present invention relates in general to communication systems, and is particularly directed to an RF power amplifier linearization mechanism, that employs digital signal processor-controlled pre- and post-distortion circuitry in the respective input and output paths of a main RF power amplifier, and predistortion circuity installed in the input path of an auxiliary, feed-forward RF power amplifier, to which the input and output of the main RF amplifier are coupled, and the output of which is combined with that of the main RF power amplifier, to produce a composite amplified signal with substantially reduced intermodulation products.

BACKGROUND OF THE INVENTION

As described in the above-referenced "536 application, communication service providers are subject to very strict bandwidth usage spectrum constraints, including technically mandated specifications and regulations imposed by the Federal Communications Commission (FCC). These rules require that sideband spillage, namely the amount of energy spillover outside a licensed band of interest, be sharply attenuated (e.g., on the order of 50 dB). Although these regulations may be easily met for traditional forms of modulation, such as FM, they are difficult to achieve using more contemporary, digitally based modulation formats, such as M-ary modulation.

Attenuating the sidebands sufficiently to meet industry or regulatory-based requirements by means of such modulation techniques requires very linear signal processing systems and components. Although relatively linear components can be implemented at a reasonable cost at relatively narrow bandwidths (baseband) of telephone networks, linearizing components such as power amplifiers at RF frequencies can be prohibitively expensive.

A fundamental difficulty in linearizing RF power amplifiers is the fact that they are inherently non-linear devices, and generate unwanted intermodulation distortion products (IMDs) that manifest themselves as spurious signals in the amplified RF output signal, such as spectral regrowth or spreading of a compact spectrum into spectral regions that do not appear in the RF input signal. This distortion causes the phase/amplitude of the amplified output signal to depart from the phase/amplitude of the input signal, and may be considered as an incidental (and undesired) amplifier-sourced modulation of the RF input signal.

An inefficient approach to linearizing an RF power amplifier is to build the amplifier as a large, high power device, and then operate the amplifier at a low power level (namely, at only a small percentage of its rated output power), where the RF amplifier's transfer characteristic is relatively linear. An obvious drawback to this approach is the overkill penalty—a costly and large sized RF device.

Other prior art techniques include baseband polar (or Cartesian) feedback, post-amplification, feed-forward correction, and pre-amplification, pre-distortion correction. In the first approach, the output of the amplifier is compared to the input and a baseband error signal is used to directly modulate the signal which enters the power amplifier. In the second approach, error (distortion) present in the RF amplifier's output signal is extracted, amplified to the proper level, and then reinjected (as a complement of the error signal back) into the output path of the amplifier, so that (ideally) the RF amplifier's distortion is effectively canceled.

In the third approach, a predistortion signal is injected into the RF input signal path upstream of the RF amplifier. The predistortion signal ideally has a characteristic that is equal and opposite to the distortion expected at the output of the high power RF amplifier, so that when subjected to the (distorting) transfer characteristic of the RF amplifier, it effectively cancels the output distortion. Predistortion may be made adaptive by measuring the distortion at the output of the RF amplifier and adjusting the predistortion control signal to minimize the distortion of the output signal of the power amplifier during real time operation.

In accordance with the invention described in the above-referenced '536 application and diagrammatically illustrated in FIG. 1, linearization of a main RF power amplifier $A_1$ is effectively achieved by using a second RF amplifier $A_2$, that is largely matched with the main RF power amplifier $A_1$. Being matched implies that the two RF amplifiers have the same transfer characteristics—both in terms of their intended RF performance and unwanted IMD components they inherently introduce into their amplified outputs.

An RF input signal to be amplified is split by a directional coupler CPL1 into two paths, a first of which adjusts the RF input signal in amplitude and phase prior to being amplified by the amplifier $A_1$. A second split RF input signal path is used to construct a signal consisting of both of the original RF input signal to be amplified by the second amplifier $A_2$, and a complementary version of the IMD products the two amplifiers inherently introduce.

By selectively combining the RF output of the RF power amplifier $A_1$ with the RF input signal in the parallel path, the gain and phase adjusted RF input signal applied to the matched amplifier $A_2$ can be made to include the same modulated RF carrier component as that applied to power amplifier $A_1$. In addition, the adjusted RF input signal to the parallel path matched amplifier $A_2$ will contain a complementary version of the intermodulation component of the output of the main path amplifier $A_1$.

The gain and phase adjustment of the input to the second amplifier $A_2$ is such that its RF output signal will have the desired RF carrier modulation component aligned with that of the main path amplifier $A_1$, but its undesired intermod component will be of equal amplitude and phase-reversed with respect to the undesired intermod component of the RF output of the main path amplifier $A_1$. Combining these two matched amplifier outputs in a quadrature hybrid CPL2 yields a composite signal, in which the desired amplified modulated RF carrier components produced by each matched amplifier constructively sum to the intended amplification level, while unwanted IMD components destructively combine or cancel, effectively leaving only the desired amplified modulated RF carrier.

SUMMARY OF THE INVENTION

In accordance with the present invention, advantage may be taken of a work function-based predistortion mechanism, to enhance the operation of the auxiliary path predistortion mechanism described in the '536 application. Pursuant to a preferred embodiment, the predistortion mechanism for the signal path of the auxiliary RF amplifier may be derived from respectively different work functions of the instantaneous amplitude of the RF input signal. As a non-limiting example, the work function-based predistortion mechanism may be of the type described in U.S. Pat. No. 5,760,646 (or '646 patent), by D. Belcher et al, entitled: "Feed-Forward Correction Loop with Adaptive Predistortion Injection for Linearization of RF Power Amplifier," issued Jun. 2, 1998, assigned to the assignee of the present application and the disclosure of which is herein incorporated. This predistortion unit serves to improve the match of the non-linear transfer characteristic between the first and second amplifiers and to reduce the additional distortion from the second amplifier, which arises from the presence of a distortion component at the input of the second amplifier, which does not exist at the input of the first amplifier.

As an addition to the linearization scheme of the above-referenced '536 application, the output of the carrier-IMD combiner is coupled to an auxiliary path-installed, processor-controlled predistortion unit that includes a processor-controlled phase shifter, a variable attenuator, and work function-based predistorter. These phase and amplitude parameters are controlled by digital signal processing circuitry, so that part of the IMD distortion is canceled within the auxiliary amplifier, and the remaining portion is canceled by the main path distortion summed in the output quadrature hybrid.

As an adjunct to phase and amplitude adjustments, the predistorter of the auxiliary path is used to further distort the input signal to the second amplifier. This may be accomplished with work function predistortion control signals generated in the manner described in the above-referenced '646 patent, being derived from respectively different work functions of the instantaneous amplitude of the RF input signal. The portion of the complementary distortion signal incident on the second amplifier, which is used to cancel the distortion energy of the main amplifier in the output quadrature hybrid is consequently predistorted to negate the non-linear effects of the second amplifier on this distortion component. In addition to reducing the distortion arising from this complementary distortion signal at the output of the second amplifier, the predistorter can also serve to provide a better match between the non-linear transfer characteristics of the main (first) and error (second) amplifiers.

DETAILED DESCRIPTION

Figure 1:
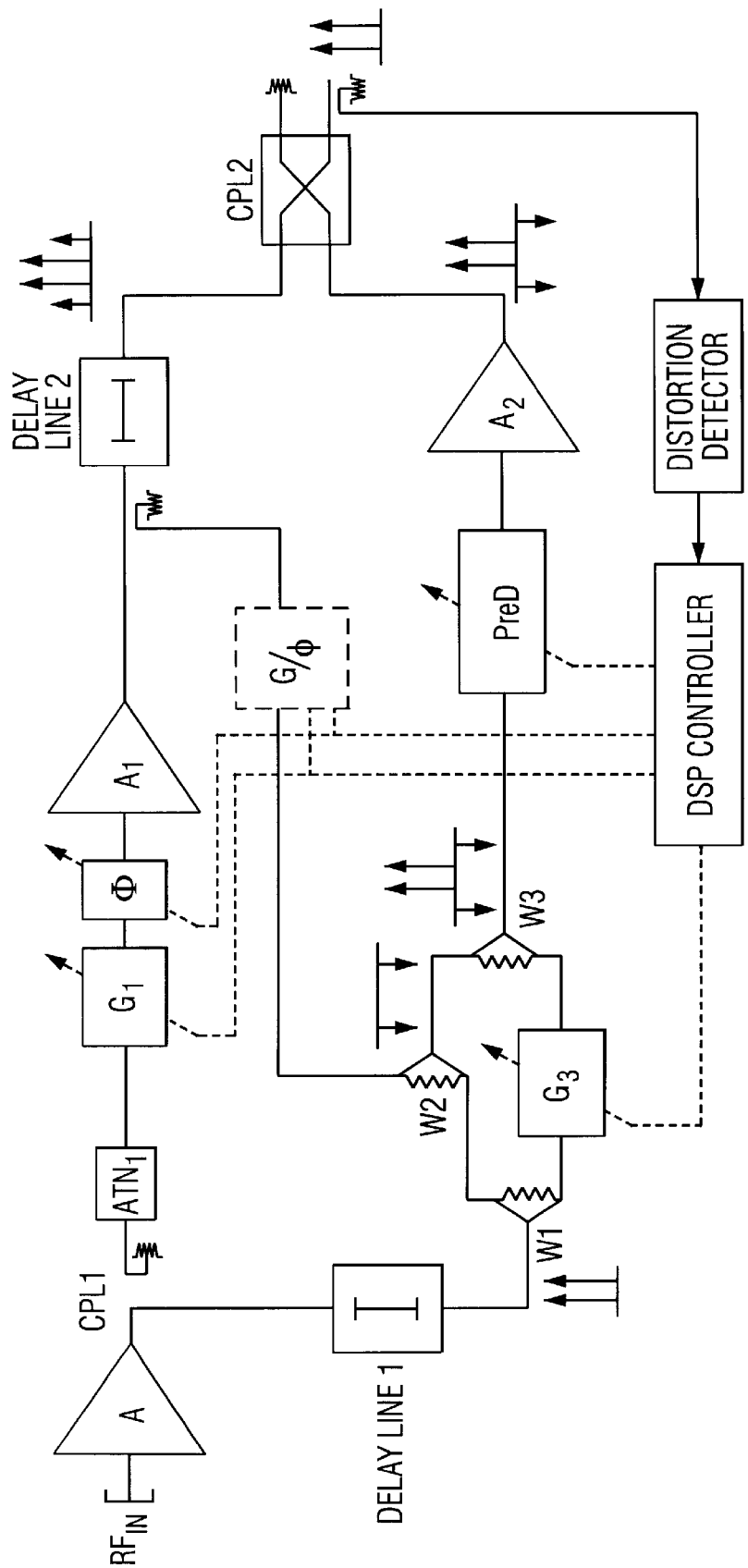
FIG. 1 diagrammatically illustrates an RF power amplifier linearization mechanism described in the above-referenced '536 application.

Before describing in detail the new and improved high efficiency feed-forward RF power amplifier linearization mechanism in accordance with the present invention, it should be observed that the invention resides primarily in a prescribed arrangement of conventional RF communication circuits, associated digital signal processing components and attendant supervisory control circuitry, that controls the operation of such circuits and components. As a result, the configuration of such circuits components and the manner in which they interface with other communication system equipment have, for the most part, been illustrated in the drawings by readily understandable block diagrams, which show only those details that are pertinent to the present invention, so as not to obscure the disclosure with details which will be readily apparent to those skilled in the art having the benefit of the description herein.

Thus, the block diagram illustrations are primarily intended to show the major components of an RF amplifier distortion correction system in a convenient functional grouping, whereby the present invention may be more readily understood. In addition, to facilitate an understanding of signal processing flow through the respective paths of the linearization system of the embodiments of the invention, reduced complexity spectral diagrams of the desired modulated RF carrier and the unwanted IMD components have been placed throughout the Figures in association with respective transfer characteristics of the system components.

Figure 2:
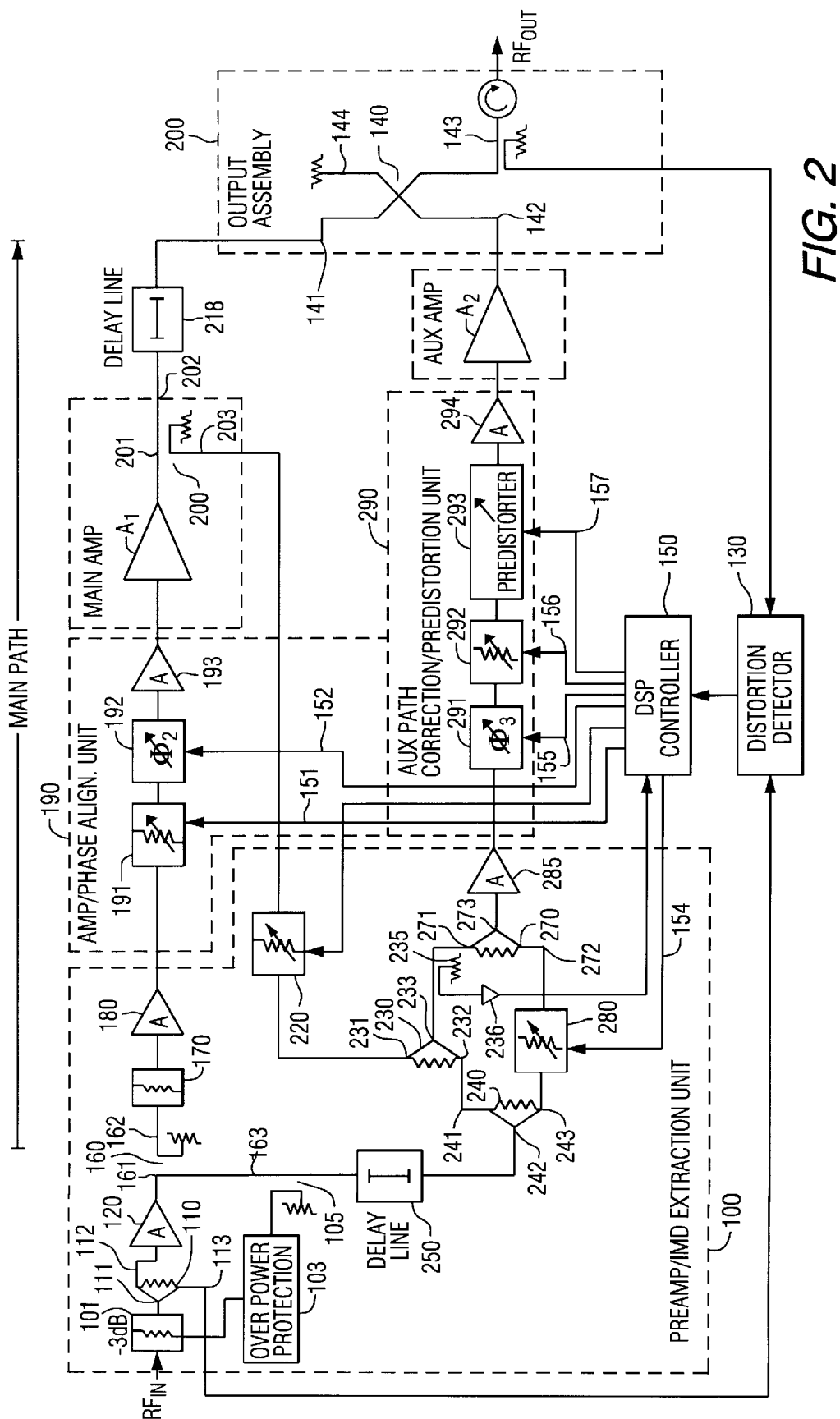
FIG. 2 diagrammatically illustrates a preferred embodiment of the present invention.

FIG. 2 diagrammatically illustrates a non-limiting example of an RF power amplifier linearization scheme in accordance with the present invention. As shown therein, an RF input signal $RF_{in}$ to be amplified by a main RF amplifier $A_1$ is coupled to a pre-amplification IMD extraction unit 100, that includes (−3 dB) attenuation pad 101 to an input 111 of a power divider, shown as a Wilkinson splitter 110. Attenuation pad 101 is coupled to an over-power protection circuit 103, that is ported to a directional coupler 105 installed in a split signal output path of an input buffer amplifier 120.

A first output port 112 of Wilkinson splitter 110 is coupled to input buffer amplifier 120, while a second output port 113 is coupled to a first input 131 of a distortion detector 130. Distortion detector 130 is operative to monitor the input RF signal, and the output port 143 of an additive cancellation quadrature hybrid 140 within an output assembly 200. In response thereto, the distortion detector 130 supplies a DSP-based controller 150 with a measure of any distortion energy in the composite RF output signal derived by combining the output of the main path RF power amplifier $A_1$ and the output of an auxiliary feed-forward RF power amplifier $A_2$, that is largely matched with RF power amplifier $A_1$.

The DSP-based controller 150 executes one or more error minimization algorithms for controlling variable attenuators and phase shifters in both main amplifier and auxiliary amplifier signal paths, to effect cancellation of IMD components at the output port 143 of quadrature hybrid 140. It also computes control signals for the predistortion unit. As described in the '646 patent, the predistortion signals can be derived from respectively different work functions of the instantaneous amplitude of the RF input signal extracted by Wilkinson splitter 110, that are used to predistort phase and amplitude components of the RF input signal to the auxiliary RF amplifier $A_2$.

The output of the buffer amplifier 120 is coupled to an input port 161 of a directional coupler 160. Directional coupler 160 has a first output port 162 coupled to a main amplifier signal path that includes a preset attenuator pad 170 and a buffer amplifier 180, the output of which is coupled through a main amplifier amplitude/phase alignment unit 190 to the main RF amplifier $A_1$. The main path amplitude/phase alignment unit 190 includes a vector modulator comprised of a processor-controlled variable attenuator 191 and phase shifter 192, that are coupled in cascaded with a buffer amplifier 193. The main path vector modulator's attenuator 191 and phase shifter 192 controllably adjust the amplitude and phase of the RF input signal applied to the main RF amplifier $A_1$, in accordance with respective amplitude and phase control signals supplied over links 151 and 152 from DSP controller 150.

The RF input signal produced by the main path amplitude/phase alignment unit 190 is supplied to the main path RF power amplifier $A_1$, the output of which is coupled to an input port 201 of a directional coupler 200. Directional coupler 200 has a first output port 202 coupled through a delay line 218 to a first input port 141 of additive cancellation quadrature hybrid 140. Quadrature hybrid 140 has a second input port 142 coupled to receive the amplified output of auxiliary feed-forward RF power amplifier $A_2$, and produces a composite amplified RF output signal at output port 143.

Delay line 250 is employed to equalize propagation delay through the main signal path and a processor-controlled variable attenuator 220, coupled between a second output port 203 of directional coupler 200 and a first input port 231 of a carrier cancellation combiner 230 (which may be configured as a Wilkinson combiner, as shown). The variable attenuator 220 controllably imparts a prescribed amount of attenuation to the second split path portion of the amplified RF output of the main path RF amplifier $A_1$, in accordance with an attenuation control signal supplied over link 153 from DSP controller 150, and serves to set the gain of the main path when the digital control loops (which drive gain and phase adjusters 191 and 192) are closed.

As described above, RF carrier cancellation combiner 230 is used to extract the IMD portion of the output of the RF amplifier $A_1$, by subtracting the split RF output signal from the main RF amplifier $A_1$ from the split RF signal in the auxiliary feed-forward path derived from the second port 163 of directional coupler 160. For this purpose, a second input port 232 of the carrier cancellation combiner 230 is coupled to a first output port 241 of a Wilkinson splitter 240, the input port 242 of which is coupled via a delay line 250 to second output port 163 of the directional coupler 160. The delay line 250 serves to equalize the propagation delay of the RF input signal from the second output port 163 of the directional coupler 160 for ensuring proper phase alignment of the signals applied to input ports 231 and 232 of carrier cancellation combiner 230.

Selectively combining the extracted distortion from the main path RF power amplifier $A_1$ with the split RF input signal produces an RF input signal with distortion products inverted with respect to the carriers, when compared to those in the main path amplifier $A_1$. This signal is then fed via gain amplifier 285 to the correction/predistortion unit 290. The resulting input signal that is coupled to the correction/predistortion unit includes the same modulated RF carrier input component applied to the main path amplifier $A_1$, and a complementary version of the intermodulation component of the output of the main path amplifier $A_1$.

The complementary intermod component of the desired composite RF input signal to the auxiliary amplifier $A_2$ is obtained by coupling the output port 233 of the RF carrier cancellation combiner 230 to a first input port 271 of a carrier-IMD combiner 270. Via a directional coupler 235, the output port 233 of the RF carrier cancellation combiner 230 is coupled to a power detector 236, the output of which is monitored by DSP controller 150 and used to control variable attenuator 191 and variable phase shifter 192, so as to minimize the signal level at the output port 233 of carrier cancellation combiner 230.

The RF input component of the composite RF input signal to the auxiliary feed-forward amplifier $A_2$ is obtained by coupling a second output port 243 of the Wilkinson splitter 240 through a controlled variable attenuator 280 to a second input port 272 of carrier-IMD combiner 270. Variable attenuator 280 is controlled by a control line 154 from DSP controller 150 to insert a controlled amount of attenuation into the path of the input RF signal extracted by directional coupler 160, which effectively sets the carrier/IMD ratio at the output of carrier/IMD combiner 270.

The output 273 of the carrier-IMD combiner 270 is coupled via buffer amplifier 285 to correction/predistortion unit 290. The predistortion unit 290 includes a processor-controlled vector modulator comprised of a phase shifter 291, and a variable attenuator 292. It also includes a predistorter 293. These three processor-controlled components are driven by respective control signals applied over lines 155, 156, and 157 from DSP controller 150, and are coupled in cascade through a buffer amplifier 294 to auxiliary RF amplifier $A_2$.

As in the main path amplitude/phase alignment unit 190, variable phase shifter 291 and attenuator 292 are operative to adjust the phase and amplitude of the RF signal supplied via predistorter 293 to the auxiliary RF amplifier $A_2$, in accordance with respective phase and amplitude control signals from DSP controller 150, and thereby introduce prescribed amounts of phase shift and attenuation to the carrier/inverted IMD signal input to the auxiliary feed-forward RF amplifier $A_2$. As described in the above-referenced '536 application, these phase and amplitude parameters are controlled, so that part of the IMD distortion is canceled within the RF amplifier $A_2$, and the remaining portion is canceled by the main path distortion summed in the quadrature hybrid 140.

As an adjunct to the respective phase and amplitude adjustments controllably imparted by phase shifter 291 and attenuator 292, the predistorter 293 is used to further distort the RF input signal to the auxiliary RF amplifier $A_2$, in accordance with predistortion control signals on line 157 from DSP processor 150. These auxiliary predistortion control signals may be generated in the manner described in the above-referenced '646 patent, and are used to control the phase and amplitude of different work functions of the instantaneous amplitude of the RF input signal from Wilkinson splitter 110.

As a consequence, predistortion unit 290 is also operative to correct for the distortion by the auxiliary amplifier $A_2$ of the complementary distortion energy that is fed forward through the auxiliary amplifier $A_2$ to the output quadrature hybrid 140 and correct for the difference in the distortion generated by the main amplifier $A_1$ and the auxiliary amplifier $A_2$, which arises from the presence of a complementary distortion signal at the input of the auxiliary amplifier, which does not exist at the input of the main path amplifier. As detailed in the '646 patent, the predistorter 293 may utilize a pair of gain and phase adjustment circuits, such as a fast variable attenuator and a fast phase shifter, respectively, coupled in cascade in the signal path to the input of auxiliary RF amplifier $A_2$.

In this predistorter, each work function signal is controllably weighted in a weighting coefficient multiplier unit, by respective amplitude and phase component-associated weighting coefficients generated by a weighting coefficient generator, in accordance with error measurements conducted on the signal at the output port 143 of quadrature hybrid 140. The error measurements may be carried out in the time domain, as by way of a coherent receiver comparing the amplifier input and output signals, to derive respective amplitude and phase error signals.

Alternatively, the error measurements may be carried out in the frequency domain by a spectral measurement unit, which looks for the presence of energy in a prescribed portion of the frequency spectrum of the amplifier output signal, to determine whether the frequency spectrum of the output signal has departed from that of the frequency spectrum of the input signal. The amount of energy transferred through a band pass filter during this swept spectral measurement is used as an indicator of spectral distortion, rather than the desired signal, and is therefore representative of error. The error measurement is then coupled to the weighting coefficient generator, which is operative adjust the weighting coefficients, in such a manner as to minimize the measured error. The RF input signal to the auxiliary amplifier $A_2$ includes both a predistorted version of the desired RF input component, as well as a predistorted version of the complementary phase IMD component extracted by the RF carrier cancellation combiner 230.

Since the RF signal to the auxiliary RF amplifier $A_2$ contains a phase-inverted version of the IMD component (as extracted by the carrier cancellation combiner 230), the RF output signal produced by RF amplifier $A_2$ will include the desired modulated RF carrier, an unwanted IMD component associated with the desired carrier, plus an amplified version of the phase-inverted IMD component that is aligned with and has a larger amplitude than the unwanted IMD produced by the main Rf amplifier $A_1$.

These two RF amplifier output signals are combined in the quadrature hybrid 140 to produce a composite signal at output port 143. As described above, this composite signal contains both a constructive summation of the desired amplified modulated RF carrier components produced by each amplifier to the intended amplification level, and a cancellation of unwanted IMD components. Phase alignment of the RF output signals produced by the RF amplifiers $A_1$ and $A_2$ is readily achieved by minimizing carrier power at the termination port 144 of the quadrature hybrid 140, or by minimizing distortion energy detected at the output 143.

As in the case of the RF power amplifier linearization mechanism described in the '536 application, the combined feed-forward and predistortion approach of the present invention does not suffer from bandwidth or instability issues, associated with feedback linearization systems, thereby providing improved performance and wider bandwidth correction at lower cost.

While we have shown and described an embodiment in accordance with the present invention, it is to be understood that the same is not limited thereto but is susceptible to numerous changes and modifications as are known to a person skilled in the art, and we therefore do not wish to be limited to the details shown and described herein, but intend to cover all such changes and modifications as are obvious to one of ordinary skill in the art.

What is claimed:

1. An RF power amplifier arrangement comprising:
   an RF input port to which an RF input signal is applied;
   an RF output port from which an RF output signal is derived;
   first and second RF signal processing paths coupled between said input and output ports and containing first and second RF power amplifiers;
   said first RF signal processing path including a first RF signal vector modulator, that is controllably operative to adjust one or more parameters of a first RF input signal component applied to said first RF power amplifier;
   said second RF signal processing path including a predistortion unit containing a second RF signal vector modulator and a predistorter, that is controllably operative to predistort a second RF input signal component applied to said second RF power amplifier in a manner that compensates for the presence of distortion energy applied to said second RF power amplifier that is not applied to said first RF power amplifier, and an intermodulation distortion (IMD) extraction circuit coupled to said RF input port and to an output of said first RF power amplifier, and being operative to generate said second RF input signal component as a combination of said RF input signal and an IMD component present in an amplified RF output signal from said first RF power amplifier; and
   an output signal combiner coupled to outputs of said first and second RF power amplifiers and said output port, and being operative to produce said RF output signal as a composite RF output signal, in which RF carrier components produced by said first and second RF power amplifiers constructively sum and IMD components produced thereby destructively combine.

2. An RF power amplifier arrangement according to claim 1, wherein said first and second RF power amplifiers are matched RF power amplifiers having the same transfer characteristic.

3. An RF power amplifier arrangement according to claim 1, wherein said IMD extraction circuit includes a cancellation combiner that is operative to differentially combine a sample of the amplified RF output signal produced by said first RF power amplifier with a portion of said RF input signal applied to said second signal processing path to derive said IMD component, and to combine said IMD component with said portion of said RF input signal applied to said second signal processing path, so as to derive said second RF input signal component as a combination of said RF input signal and said IMD component where said IMD component is phase-inverted with respect to said RF carrier component when compared to the output of the first RF power amplifier.

4. An RF power amplifier arrangement according to claim 3, further including a controller which is operative to control said second vector modulator in accordance with intermodulation distortion energy measured at the output of said output signal combiner.

5. An RF power amplifier arrangement according to claim 2, further including a controller which is operative to control said first and second controlled RF signal vector modulators in accordance with a measure of intermodulation distortion energy produced in at least one of said first and second RF power amplifiers.

6. An RF power amplifier arrangement according to claim 5, further including an IMD distortion detector coupled to said output port and being operative to couple a measure of IMD distortion in said RF output signal to said controller.

7. An RF power amplifier arrangement according to claim 2, wherein said first RF signal vector modulator includes an amplitude/phase alignment unit, coupled in series with said first RF power amplifier, that is controllably operative to adjust the amplitude and phase of said first RF input signal components applied to said first RF power amplifier, and further including a controlled attenuator installed between said output of said first RF power amplifier and said IMD extraction circuit, and further including a controller which is operative to control said amplitude/phase alignment unit and said controlled attenuator in accordance with a measure of intermodulation distortion energy produced in at least one of said first and second RF power amplifiers.

8. An RF power amplifier arrangement according to claim 1, wherein said first and second controlled RF signal vector modulators are controllably operative to adjust the phase and amplitude of said first and second RF input signal components applied to said first and second RF power amplifiers, and further including a controller which is operative to control said RF signal predistorter in accordance with a measure of intermodulation distortion energy produced in at least one of said first and second RF power amplifiers.

9. An RF power amplifier arrangement comprising main and parallel RF signal processing paths coupled to an RF signal input port to which a modulated RF carrier signal is applied, said main path including a main path amplitude/phase alignment unit coupled to a first, main path RF power amplifier, said parallel path including a parallel path predistortion circuit coupled to a second parallel path RF power amplifier in a manner that compensates for the presence of distortion energy applied to said second, parallel path RF power amplifier that is not applied to said first, main path RF power amplifier, said parallel path predistortion circuit being controllably operative to predistort an RF signal component applied to said second RF power amplifier, and an intermodulation distortion extraction circuit coupled to said main and parallel paths and being operative to extract an intermodulation distortion component present in an amplified RF output signal from said first RF power amplifier, and an RF signal processing path combiner that is operative to combine RF outputs of said main and parallel path amplifiers to produce a composite RF output signal in which amplified modulated RF carrier components produced by said main and parallel path RF amplifiers constructively sum and intermodulation distortion components produced thereby destructively combine.

10. An RF power amplifier arrangement according to claim 9, wherein said first and second RF power amplifiers are matched RF power amplifiers having the same transfer characteristic.

11. An RF power amplifier arrangement according to claim 9, wherein said parallel path predistortion circuit is controllably operative to predistort said RF signal component applied to said second RF power amplifier in accordance with different work functions of the instantaneous amplitude of said modulated RF carrier signal.

12. An RF power amplifier arrangement according to claim 9, wherein said intermodulation distortion extraction circuit is operative to differentially combine an amplified RF output signal produced by said main path RF power amplifier with a portion of said modulated RF carrier signal to derive said intermodulation distortion component, and wherein said parallel signal processing path is configured to combine said intermodulation distortion component with a portion of said modulated RF carrier signal for application to said parallel path predistortion circuit.

13. An RF power amplifier arrangement according to claim 11, further including a controller which is operative to control said main path and parallel path predistortion circuits in accordance with a measure of intermodulation distortion energy produced in at least one of said main and parallel path RF power amplifiers.

14. An RF power amplifier arrangement according to claim 12, further including a controller which is operative to control said main path and parallel path predistortion circuits in accordance with said intermodulation distortion component.

15. An RF power amplifier arrangement according to claim 14, further including an intermodulation distortion component detector coupled to an output port of said RF signal processing path combiner and being operative to couple a measure of intermodulation distortion to said controller.

16. An RF power amplifier arrangement according to claim 14, wherein said main path predistortion circuit is controllably operative to adjust the amplitude and phase of a main path RF carrier signal applied to said main path RF power amplifier, and further including a controlled attenuator installed between said output of said main path RF power amplifier and said intermodulation component extraction circuit, and further including a controller which is operative to control said main path predistortion circuit and said controlled attenuator to minimize the power detected at the output of a carrier cancellation combiner.

17. An RF power amplifier arrangement according to claim 12, wherein said main path and parallel path predistortion circuits are controllably operative to adjust the phase and amplitude of main path and parallel path modulated RF carrier signals applied to said main path and parallel path RF power amplifiers, and further including a controller which is operative to control said predistortion circuits in accordance with a measure of intermodulation distortion energy produced in at least one of said main path and parallel path RF power amplifiers.

18. An RF power amplifier arrangement according to claim 1, wherein said predistorter is operative to predistort said second RF input signal component applied to said second RF power amplifier in accordance with different work functions of the instantaneous amplitude of said RF input signal.

19. An RF power amplifier arrangement according to claim 3, wherein said IMD extraction circuit further includes a variable attenuator which is operative to controllably attenuate said portion of said RF input signal applied to said second signal processing path and thereby set the carrier/IMD ratio of said second RF input signal component.

20. An RF power amplifier arrangement according to claim 12, wherein said intermodulation distortion extraction circuit further includes a variable attenuator which is operative to controllably attenuate said portion of said modulated RF carrier signal applied to said parallel signal processing path and thereby set the carrier/intermodulation distortion ratio of said RF signal component applied to said parallel path predistortion circuit.

* * * * *

UNITED STATES PATENT AND TRADEMARK OFFICE
CERTIFICATE OF CORRECTION

PATENT NO. : 6,104,241
DATED : August 15, 2000
INVENTOR(S) : Armando C. Cova and Lance T. Mucenieks It is certified that error appears in the above-identified patent and that said Letters Patent is hereby corrected as shown below:

Title page and col. 1,

In the title:  Delete: "High Efficiency Feed-Forward RF Power Amplifier with Predistoration Enchancement"

Insert --HIGH EFFICIENCY FEED-FORWARD RF POWER AMPLIFIER WITH PREDISTORTION ENHANCEMENT--

Column 1, Line 1  Delete: "High Efficiency Feed-Forward RF Power Amplifier with Predistoration Enchancement"

Insert --HIGH EFFICIENCY FEED-FORWARD RF POWER AMPLIFIER WITH PREDISTORTION ENHANCEMENT--

Signed and Sealed this

First Day of May, 2001

Attest:

NICHOLAS P. GODICI

*Attesting Officer*   *Acting Director of the United States Patent and Trademark Office*